US012615731B2

(12) United States Patent
Wingfield

(10) Patent No.: US 12,615,731 B2
(45) Date of Patent: Apr. 28, 2026

(54) LOCKING MECHANISM FOR SLIDING COMPONENTS

(71) Applicant: Dell Products L.P., Round Rock, TX (US)

(72) Inventor: Megan C. Wingfield, Box Elder, SD (US)

(73) Assignee: Dell Products L.P., Round Rock, TX (US)

( * ) Notice: Subject to any disclaimer, the term of this patent is extended or adjusted under 35 U.S.C. 154(b) by 279 days.

(21) Appl. No.: 18/462,053

(22) Filed: Sep. 6, 2023

(65) Prior Publication Data

US 2025/0081379 A1 Mar. 6, 2025

(51) Int. Cl.
H05K 7/14 (2006.01)
(52) U.S. Cl.
CPC .................................. H05K 7/1487 (2013.01)
(58) Field of Classification Search
CPC .................................................... H05K 7/1487
USPC .......................................................... 361/726
See application file for complete search history.

(56) References Cited

U.S. PATENT DOCUMENTS

| | | | | |
|---|---|---|---|---|
| 6,711,859 | B2 | 3/2004 | Bell | |
| 7,423,869 | B2 * | 9/2008 | Su | G06F 1/187 |
| | | | | 361/679.33 |
| 7,735,669 | B2 | 6/2010 | Liang | |
| 10,184,506 | B2 * | 1/2019 | Chen | G04B 37/1486 |
| 10,798,837 | B1 | 10/2020 | Sauer | |
| 11,169,581 | B1 | 11/2021 | Lewis | |
| 11,449,110 | B2 | 9/2022 | Lin | |
| 2020/0159970 | A1 | 5/2020 | Shih | |
| 2020/0340272 | A1 | 10/2020 | Westphall | |
| 2020/0375057 | A1 | 11/2020 | Chang | |
| 2024/0109756 | A1 | 4/2024 | Braun et al. | |

* cited by examiner

*Primary Examiner* — Imani N Hayman
*Assistant Examiner* — Ross Terry Mularski
(74) *Attorney, Agent, or Firm* — Jackson Walker L.L.P.

(57) ABSTRACT
A system may include a first alignment feature, a spring-loaded locking feature mechanically coupled to the first alignment feature, the spring-loaded locking feature having a recess formed therein, a second alignment feature configured to mechanically engage with the first alignment feature in order to, when the first alignment feature is mechanically engaged with the second alignment feature, constrain translation of the first alignment feature to the second alignment feature to a linear translation, and a plunger assembly mechanically coupled to the second alignment feature via a compressive spring that mechanically biases the plunger towards the second alignment feature, the plunger assembly comprising a plunger and a tongue extending from the plunger.

9 Claims, 10 Drawing Sheets

LOCKING MECHANISM FOR SLIDING COMPONENTS

TECHNICAL FIELD

The present disclosure relates in general to information handling systems, and more particularly to systems and methods for providing a removable and reusable fixture for a physical object, such as an information handling system server, wherein such removable fixture is adapted for use with a vacuum hoist for lifting and moving the physical object.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling system servers are often heavy and difficult for a person to lift without the aid of specialized tools or devices to assist in lifting and moving servers. This is particularly true in packaging of servers into boxes, as repetitive lifting and moving of servers may cause injury to an operator. Accordingly, vacuum hoists are often used for packaging heavy server products, so as to prevent injury to an operator, prevent damage to the server products being packaged, and allow for a single operator to package a heavy server. A vacuum hoist may comprise a system, device, or apparatus that employs a mechanical vacuum wherein vacuum heads are engaged with a surface of the server to create a mechanical force that offsets and/or overcomes the force of gravity upon the server to lift and move the server.

However, one disadvantage in using vacuum hoists is that servers often include seams and embossing that render it difficult for vacuum heads of the vacuum hoist to form an airtight vacuum seal. Thus, in some instances, vacuum heads may not fully attach, leading to risk of dropping of the server, which could cause damage. Further, some segments of a surface of an information handling system server may deform during lifting, which could also damage the server.

Accordingly, systems and methods that overcome such disadvantages may be desirable.

SUMMARY

In accordance with the teachings of the present disclosure, the disadvantages and problems associated with use of a vacuum hoist to lift and move an information handling system or other physical object may be reduced or eliminated.

In accordance with embodiments of the present disclosure, a cover assembly may include a cover having a top surface which is generally planar and substantially void of any features formed thereon and one or more alignment features mechanically coupled to a side of the cover and configured to mechanically engage with one or more corresponding alignment features of a physical object in order to, when the one or more alignment features are mechanically engaged with the one or more corresponding alignment features, constrain translation of the cover relative to the physical object to a linear translation.

In accordance with these and other embodiments of the present disclosure, a wing may include one or more keyholes configured to mechanically engage with one or more corresponding coupling structures on a physical object and one or more alignment features configured to mechanically engage with one or more corresponding alignment features of a side of a cover assembly in order to, when the one or more alignment features are mechanically engaged with the one or more corresponding alignment features, constrain translation of the cover relative to the physical object to a linear translation.

In accordance with these and other embodiments of the present disclosure, a removable fixture may include a cover assembly, comprising a cover having a top surface which is generally planar and substantially void of any features formed thereon, one or more first alignment features mechanically coupled to a side of the cover, and a wing. The wing may have one or more keyholes configured to mechanically engage with one or more corresponding coupling structures on a physical object and one or more second alignment features configured to mechanically engage with the one or more first alignment features in order to, when the one or more first alignment features are mechanically engaged with the one or more second alignment features, constrain translation of the cover relative to the physical object to a linear translation.

In accordance with these and other embodiments of the present disclosure, a system may include a first alignment feature, a spring-loaded locking feature mechanically coupled to the first alignment feature, the spring-loaded locking feature having a recess formed therein, a second alignment feature configured to mechanically engage with the first alignment feature in order to, when the first alignment feature is mechanically engaged with the second alignment feature, constrain translation of the first alignment feature to the second alignment feature to a linear translation, and a plunger assembly mechanically coupled to the second alignment feature via a compressive spring that mechanically biases the plunger towards the second alignment feature, the plunger assembly comprising a plunger and a tongue extending from the plunger. The spring-loaded locking feature may be configured to, as first alignment feature is translated relative to the second alignment feature in a first direction, mechanically translate to a locked position under a spring force bias in order to mechanically engage with a lock engagement feature of the second alignment feature in order to mechanically retain the first alignment feature in a fixed position relative to the second alignment feature. When the spring-loaded locking feature is translated into a unlocked position, the tongue may be configured to mechanically engage with the recess to overcome the spring force bias to maintain the spring-loaded locking feature in an unlocked position.

In accordance with these and other embodiments of the present disclosure, a system may include a first alignment feature and a spring-loaded locking feature mechanically coupled to the first alignment feature, the spring-loaded locking feature having a recess formed therein. The first alignment feature may be configured to mechanically engage with a second alignment feature in order to, when the first alignment feature is mechanically engaged with the second alignment feature, constrain translation of the first alignment feature to the second alignment feature to a linear translation. The spring-loaded locking feature may be configured to, as the first alignment feature is translated relative to the second alignment feature in a first direction, mechanically translate to a locked position under a spring force bias in order to mechanically engage with a lock engagement feature of the second alignment feature in order to mechanically retain the first alignment feature in a fixed position relative to the second alignment feature. When the spring-loaded locking feature is translated into an unlocked position, a tongue of a plunger assembly mechanically coupled to the second alignment feature via a compressive spring that mechanically biases a plunger of the plunger assembly mechanically coupled to the tongue towards the second alignment feature may be configured to mechanically engage with the recess to overcome the spring force bias to maintain the spring-loaded locking feature in an unlocked position.

In accordance with these and other embodiments of the present disclosure, a system may include a first alignment feature configured to mechanically engage with a second alignment feature in order to, when the first alignment feature is mechanically engaged with the second alignment feature, constrain translation of the first alignment feature to the second alignment feature to a linear translation and a plunger assembly mechanically coupled to the first align- ment feature via a compressive spring that mechanically biases the plunger towards the first alignment feature, the plunger assembly comprising a plunger and a tongue extend- ing from the plunger. A spring-loaded locking feature mechanically coupled to the second alignment feature may be configured to, as the second alignment feature is trans- lated relative to the first alignment feature in a first direction, mechanically translate to a locked position under a spring force bias in order to mechanically engage with a lock engagement feature of the first alignment feature in order to mechanically retain the second alignment feature in a fixed position relative to the first alignment feature. When the spring-loaded locking feature is translated into an unlocked position, the tongue may be configured to mechanically engage with the recess to overcome the spring force bias to maintain the spring-loaded locking feature in an unlocked position.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodi- ments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 5B, wherein like numbers are used to indicate like and corresponding parts.

For the purposes of this disclosure, an information han- dling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU"), microcontroller, or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit com- munication between the various hardware components.

Figure 1:
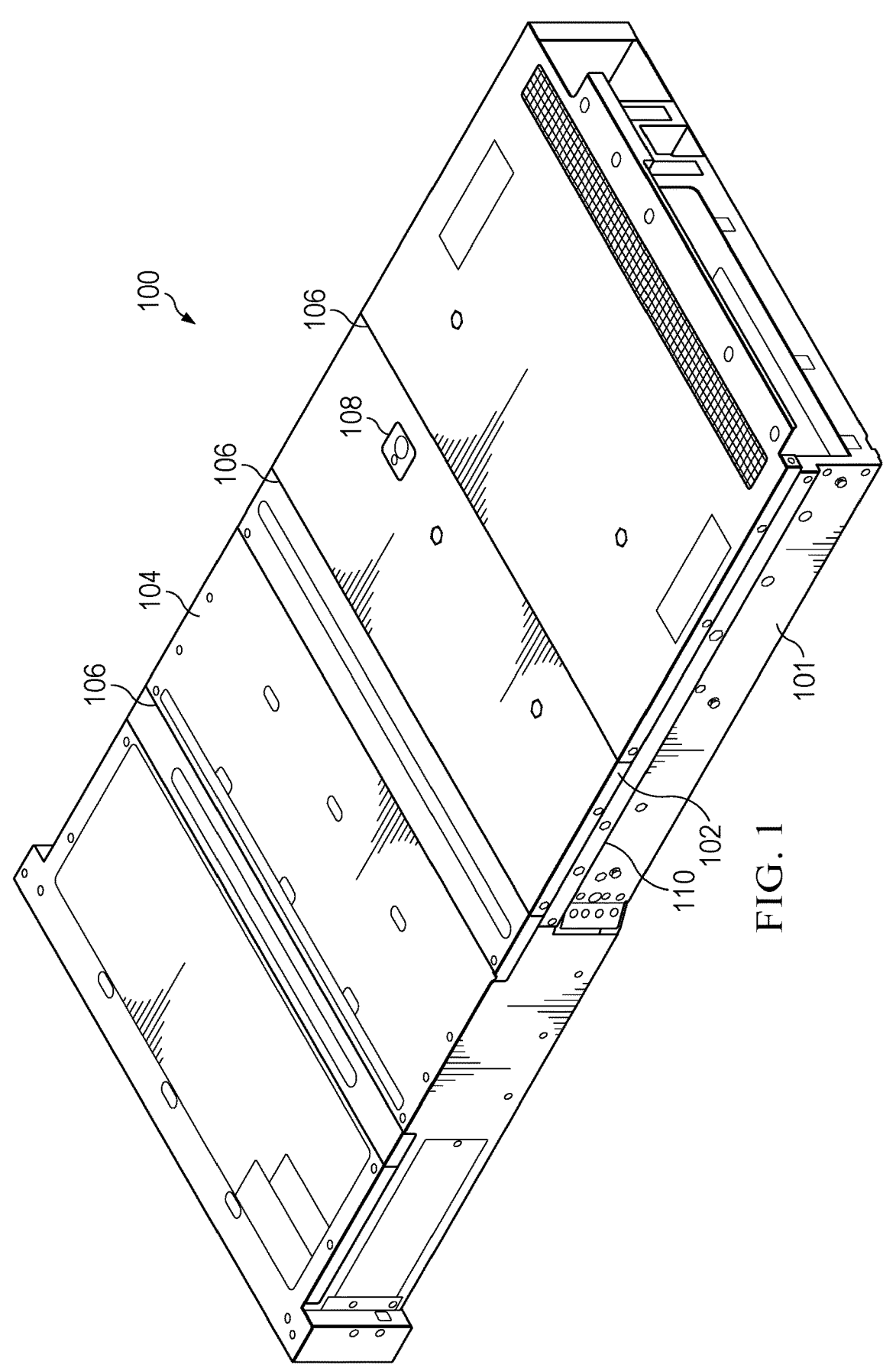
FIG. 1 illustrates a perspective view of an example information handling system server, in accordance with embodiments of the present disclosure.

FIG. 1 illustrates a perspective view of an example information handling system server 100, in accordance with embodiments of the present disclosure. As shown in FIG. 1, server 100 may include a chassis 101 made of metal or other suitable material for housing functional components of the server 100 (e.g., processors, memories, storage drives, fans, etc.). Chassis 101 may include, among other things, sides 102, a top 104, and a bottom. As shown in FIG. 1, top 104 may include a generally planar surface that may include features, such as seams 106 and embosses 108, that may pose difficulties for a vacuum head of a vacuum hoist to form an airtight vacuum seal of the surface of top 104. As also shown in FIG. 1, enclosure 101 may include rail attachment features 110 configured to mechanically engage with corresponding rails of an enclosure (e.g., server rack or server tower) in order to locate and retain chassis 101 within a desired location of such enclosure.

Figure 2A:
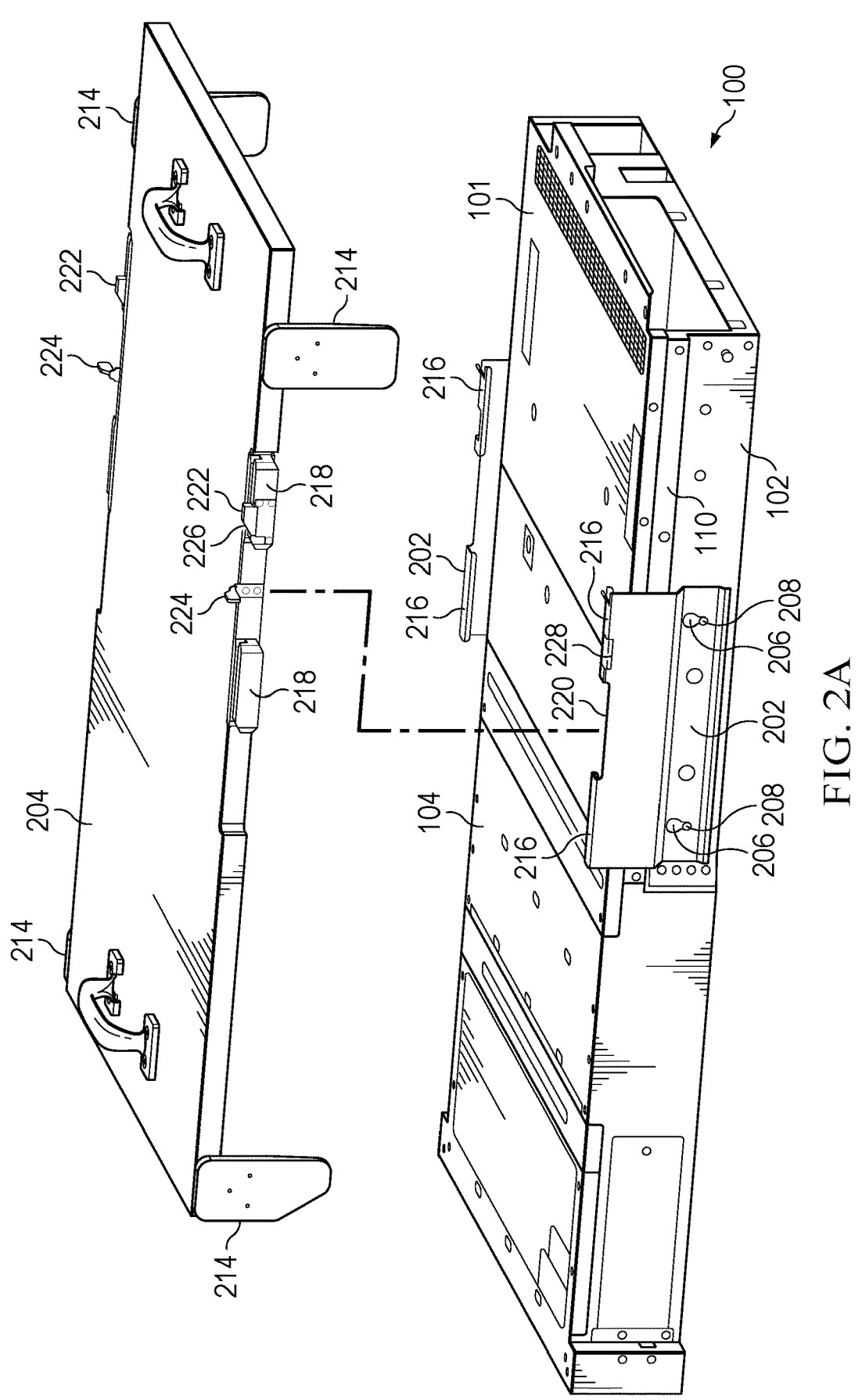
FIGS. 2A-2C illustrate perspective views of a removable fixture mechanically coupled to an information handling system server, the fixture for use with a vacuum hoist for lifting and moving the information handling system server, in accordance with embodiments of the present disclosure.
Figure 2B:
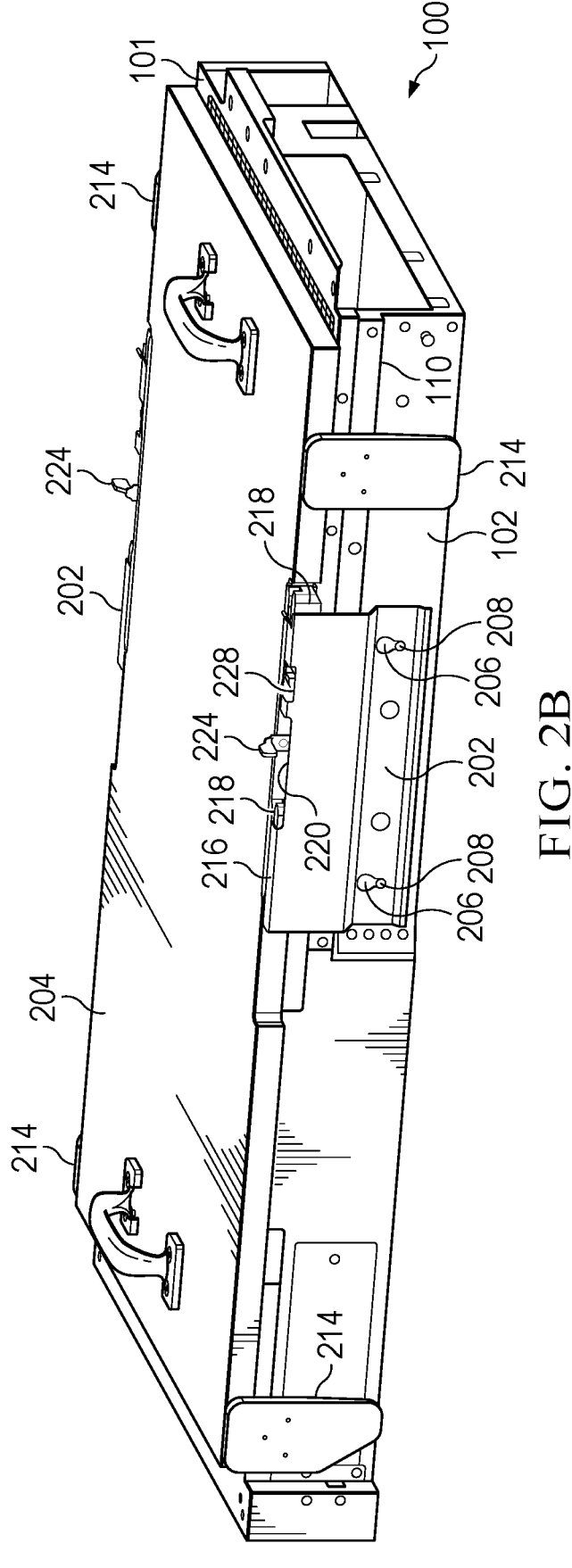
Figure 2C:
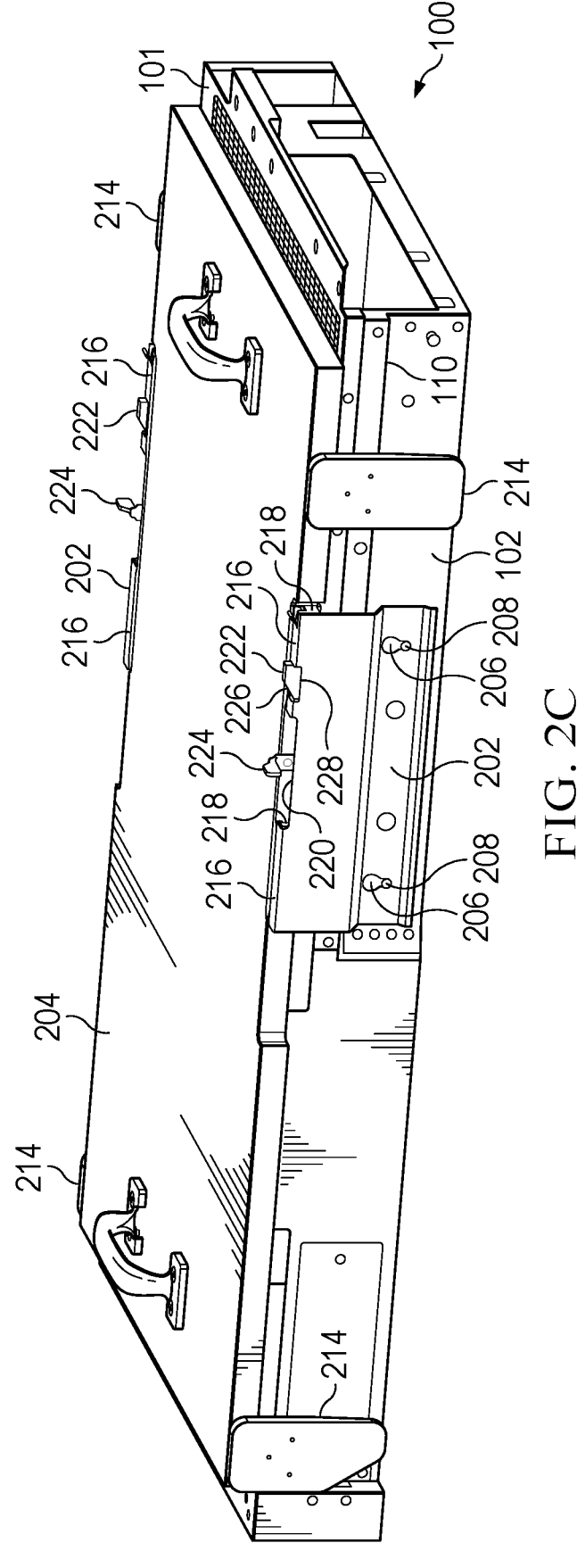
Figure 3A:
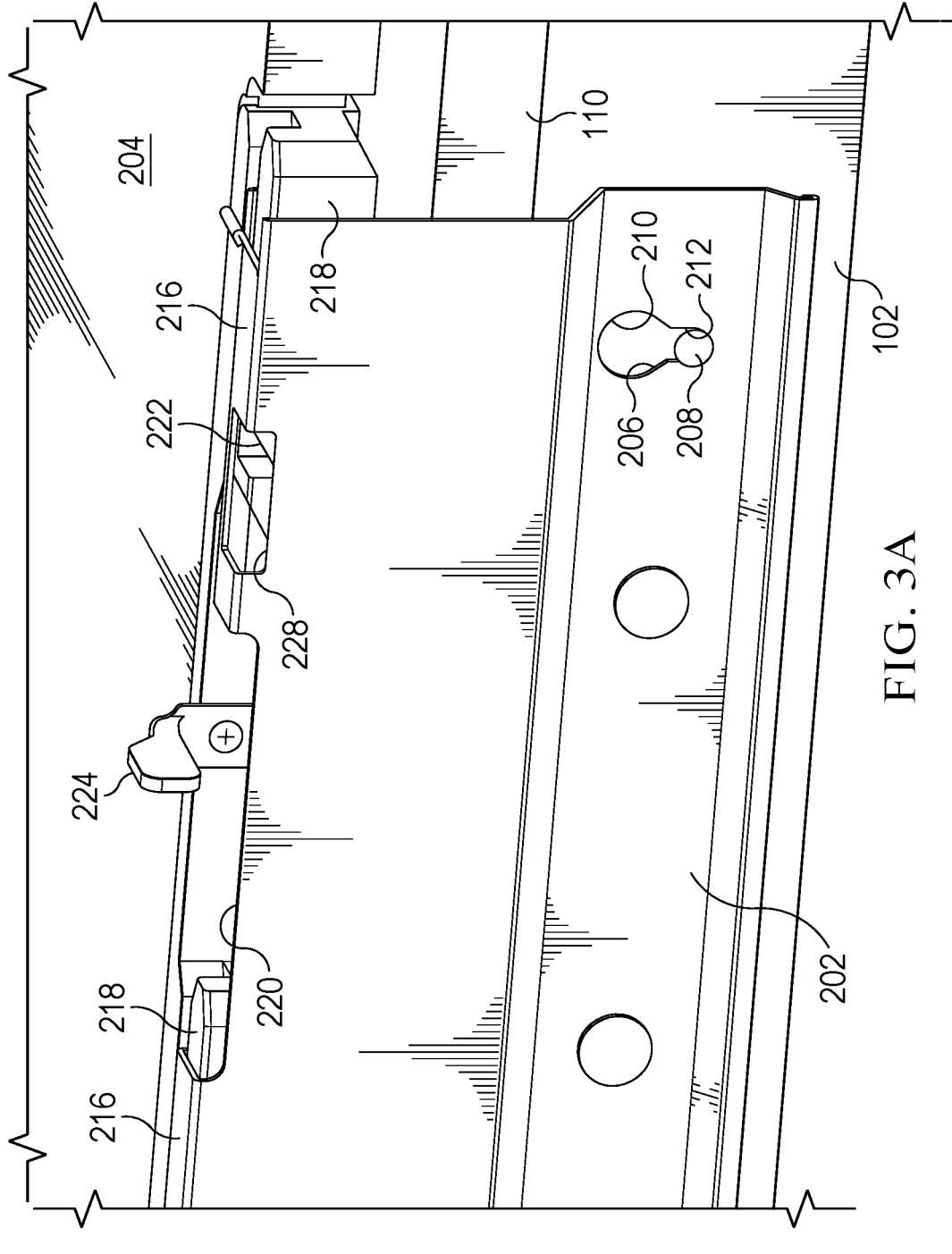
FIGS. 3A and 3B illustrate perspective close-in views of details of a wing and a cover of the removable fixture depicted in FIGS. 2A-2C, in accordance with embodiments of the present disclosure.
Figure 3B:
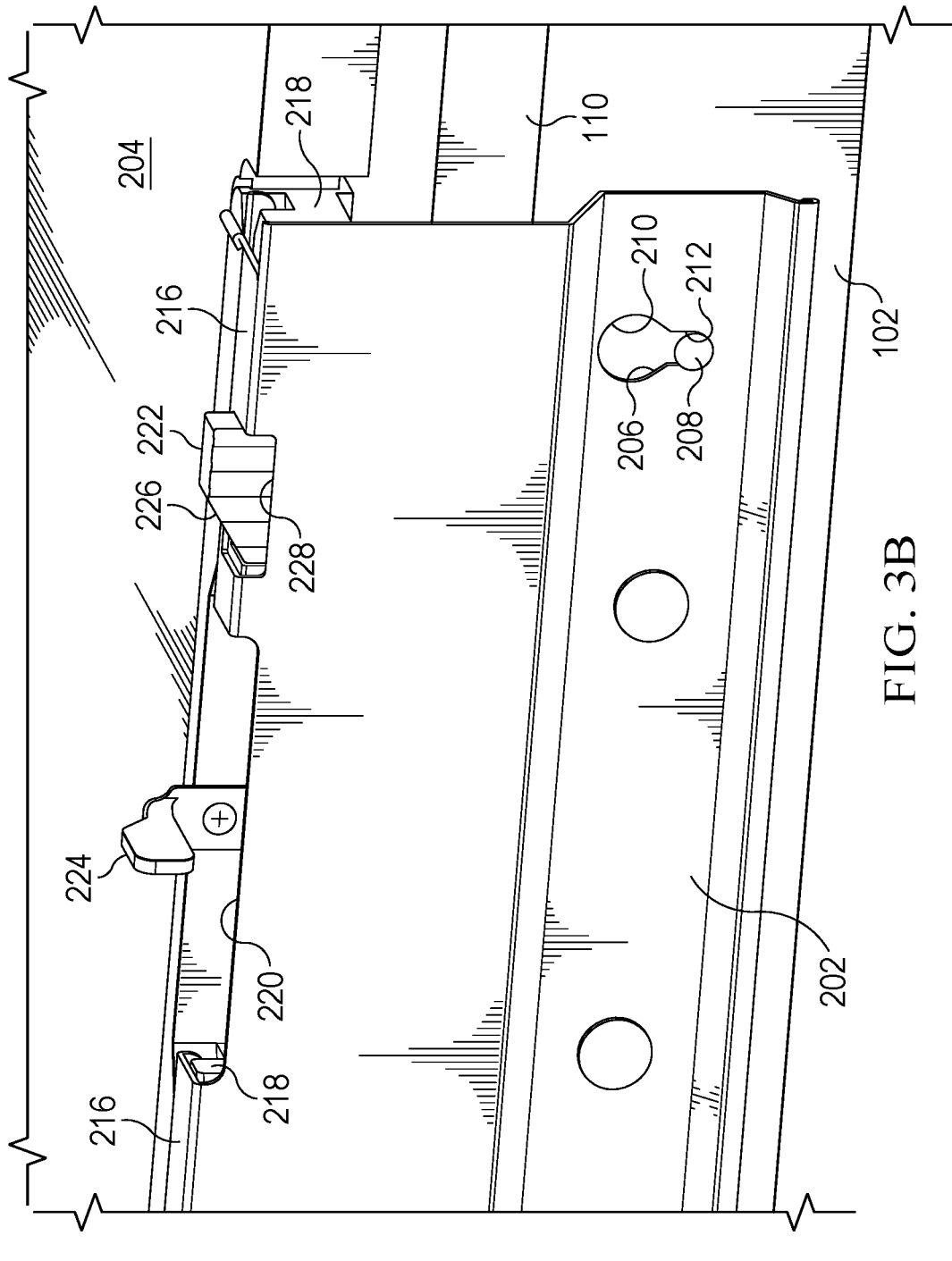

FIGS. 2A-2C (which may be referred to herein collectively as "FIG. 2") illustrate perspective views of a removable fixture mechanically coupled to information handling system server 100, the fixture for use with a vacuum hoist for lifting and moving information handling system server 100, in accordance with embodiments of the present disclosure. FIGS. 3A and 3B illustrate perspective close-in views of details of a wing 202 and a cover 204 of the removable fixture depicted in FIGS. 2A-2C, in accordance with embodiments of the present disclosure.

As shown in FIG. 2, the removable fixture may include a pair of removable wings 202 mechanically coupled to opposite sides 102 of chassis 101. In some embodiments, removable wings 202 may be coupled to chassis 101 at approximately the center of gravity of information handling system server 100. As shown in FIGS. 2 and 3, each wing 202 may include a plurality of keyholes 206 configured to mechanically engage with corresponding t-pins 208 extending from a side 102 of chassis 101. Thus, to mechanically couple a wing 202 to a side 102 of chassis 101, an operator may align larger-diameter portions 210 (see FIG. 3) of keyholes 206 with t-pins 208 and translate wing 202 towards side 102 such that heads of t-pins 208 pass through larger-diameter portions 210 of keyholes 206. The operator may then slide (e.g., upward in the perspective shown in FIGS. 2 and 3) wing 202 such that necks of t-pins 208 slide from larger-diameter portions 210 of keyholes 206 to smaller-diameter portions 212 (see FIG. 3) of keyholes 206, wherein such smaller-diameter portions 212 may be smaller in diameter than the heads of t-pins 208, thus enabling t-pins 208 and wing 202 to mechanically engage and causing wing 202 to be mechanically coupled to side 102 in a fixed position. In some embodiments, wing 202 may include one or more magnets or be made in whole or part from ferromagnetic material to provide further mechanical retention between wing 202 and side 102. In these and other embodiments, wings 202 may be configured (e.g., sized and shaped) to mechanically engage with rail attachment features 110 to provide further mechanical retention between wing 202 and chassis 101.

Cover 204 may have a top surface which is generally planar and substantially void of any features formed thereon or therein that may negatively affect forming of an airtight vacuum seal by a vacuum head of a vacuum hoist. Cover 204 may be formed from any suitable material, including without limitation metal, plastic, or ceramic. As shown in FIG. 2, in some embodiments, cover 204 may have one or more guiding features 214 extending therefrom that assist an operator in guiding and aligning cover 204 onto chassis 101 when coupling cover 204 to chassis 101, as described in greater detail below.

As shown in FIGS. 2 and 3, each wing 202 may include alignment features 216 configured to engage with corresponding alignment features 218 of mechanically coupled to opposite sides of cover 204. Together, alignment features 216 and 218 may be configured (e.g., sized and/or shaped) to, when cover 204 is lowered onto chassis 101, mechanically engage with one another to constrain mechanical translation of cover 204 relative to chassis 101 to a linear translation.

Further, as shown in FIGS. 2 and 3, each cover 204 may include on opposite sides thereof (e.g., proximate to an alignment feature 218 or integral to an alignment feature 218 as shown in FIGS. 2 and 3) a spring-loaded locking feature 222. Spring-loaded locking feature 222 may be biased by a spring to an open position (e.g., as shown in FIGS. 2A, 2C, and 3B) in the absence of a mechanical force applied to spring-loaded locking feature 222, and may be configured to, when a mechanical force is applied to spring-loaded locking feature 222 in a direction opposite to the spring force of the spring of spring-loaded locking feature 222, translate to a retracted position (e.g., as shown in FIGS. 2B and 3A).

In order to mechanically couple cover 204 to chassis 101, an operator may lower cover 204 onto top surface 104 of chassis 101, using guiding features 214 (if present) to align sides of cover 204 with sides 102 of chassis 101. As cover 204 is lowered onto chassis 101, a guiding feature 218 of each side of cover 204 may pass through an opening 220 formed between alignment features 216 of wing 202. Once alignment feature 218 of each side of cover 204 has passed through its corresponding opening 220, an operator may apply a force to cover 204 (e.g., via side handles 224) to slide (e.g., leftward in the perspective shown in FIGS. 2 and 3) cover 204 relative to chassis 101, such that alignment features 216 and alignment features 218 mechanically engage with each other to maintain desired alignment of cover 204 relative to chassis 101 during mechanical translation of cover 204 relative to chassis 101.

During such mechanical translation, a ramped portion 226 of spring-loaded locking feature 222 may mechanically engage with an alignment feature 216 such that the alignment feature 216 applies a force to ramped portion 226 to cause spring-loaded locking feature 222 to translate from its open position to its retracted position. Spring-loaded locking feature 222 may remain in such retracted position as it passes under the alignment feature 216, until cover 204 is translated to a position in which spring-loaded locking feature 222 aligns with a lock engagement feature 228 formed within such alignment feature 216, at which point a lack of force applied to spring-loaded locking feature 222 may cause spring-loaded locking feature 222 to translate to its open position under the force of the spring of spring-loaded locking feature 222. Once in such open position, spring-loaded locking feature 222 may mechanically engage with lock engagement feature 228 to maintain cover 204 in a fixed position relative to chassis 101.

With cover 204 mechanically affixed to information handling system server 100 as described above, an operator may cause one or more vacuum pads of a vacuum hoist to engage with the top surface of cover 204 in order to lift and/or move information handling system server 100 to a desired location (e.g., into a box or other packaging). Once information handling system server 100 has been moved to a desired location, the operator may decouple cover 204 from chassis 101 by unlocking spring-loaded locking feature 222 from lock engagement feature 228 by applying a force to spring-loaded locking feature 222 to cause spring-loaded locking feature 222 to translate into its retracted position, and then mechanically translate cover 204 relative to chassis 101 in a direction opposite to that used to couple cover 204 to chassis 101.

Figure 4A:
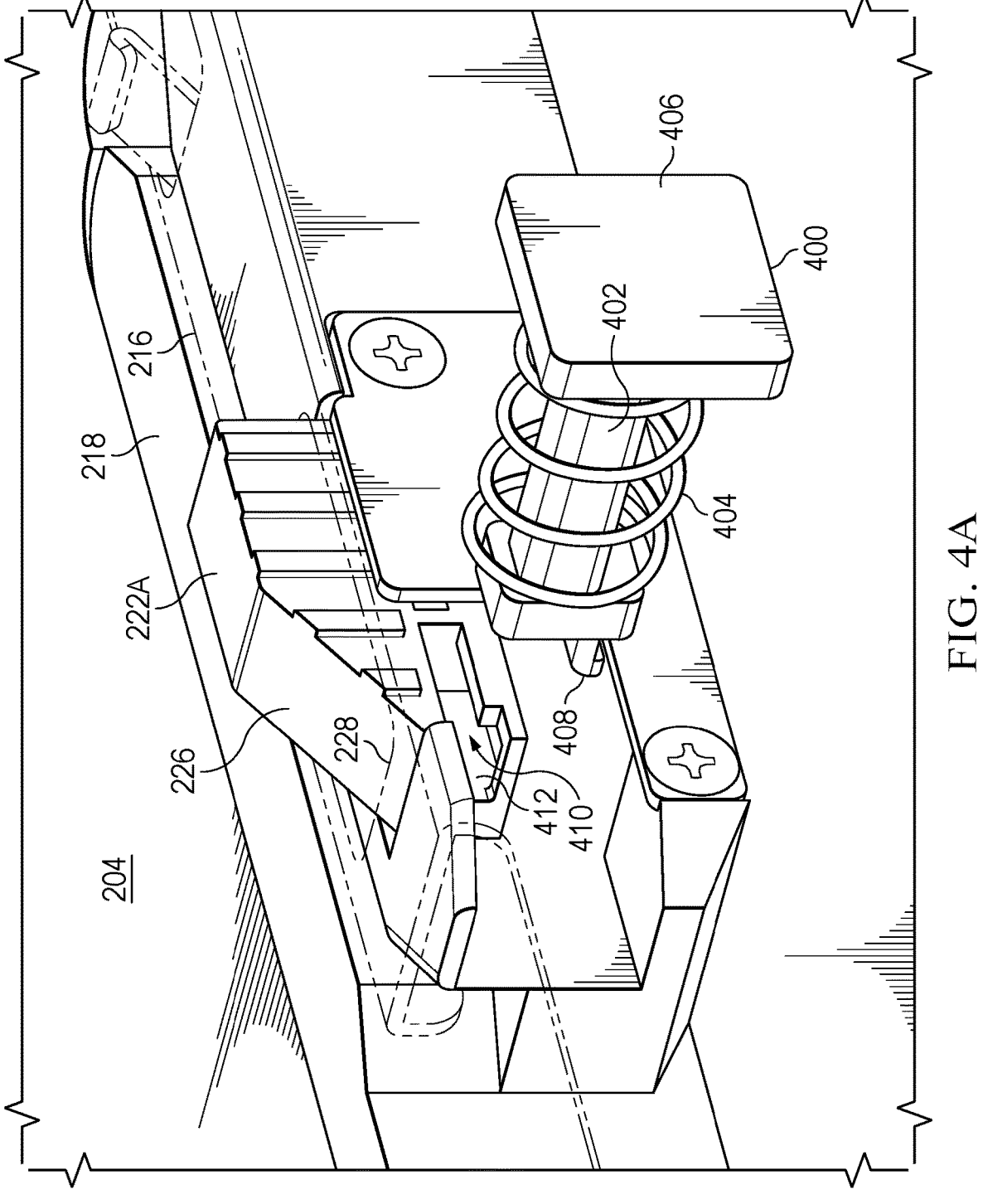
FIGS. 4A and 4B illustrate perspective close-in views of a spring-loaded locking mechanism, in accordance with embodiments of the present disclosure.
Figure 4B:
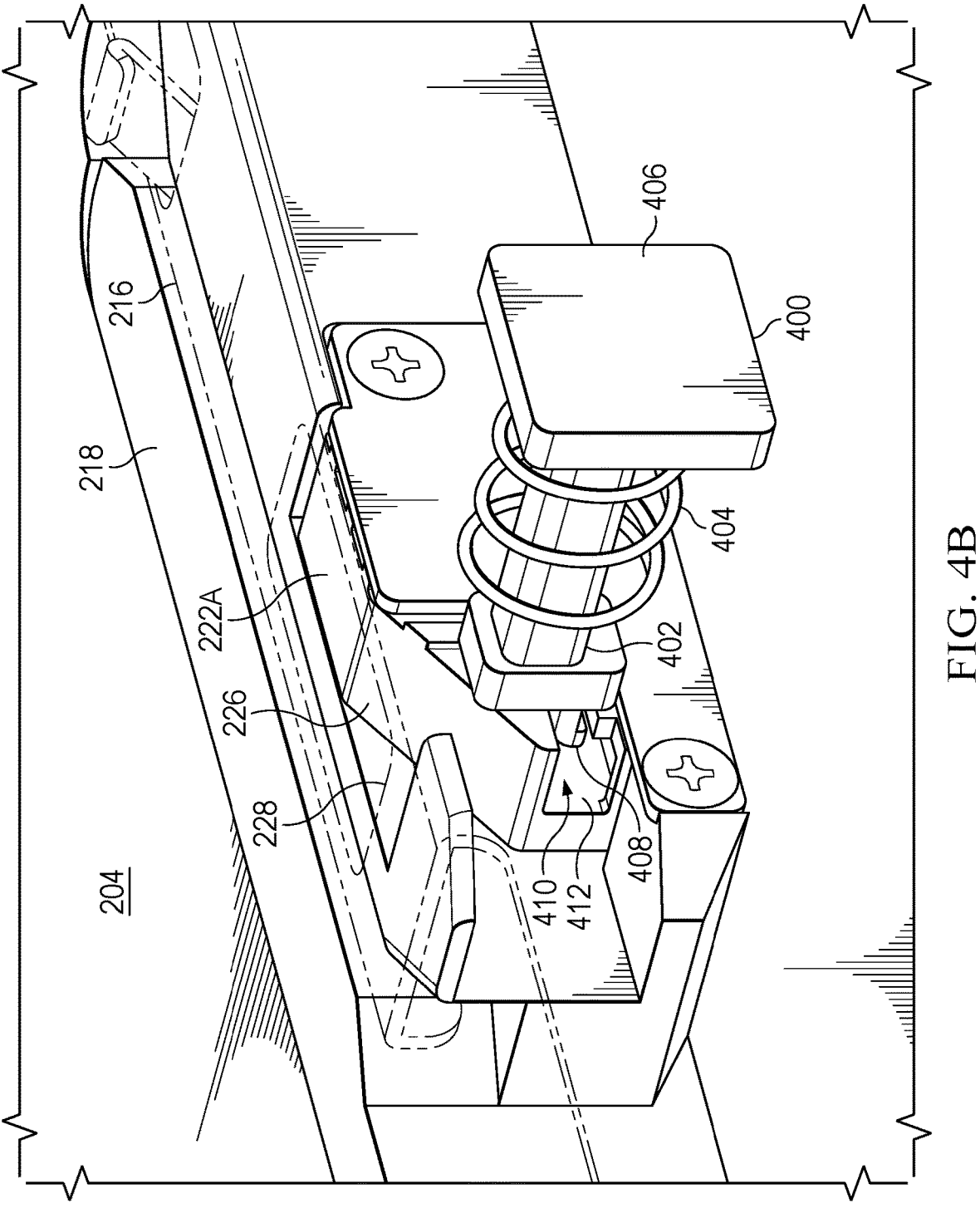

FIGS. 4A and 4B illustrate perspective close-in views of a spring-loaded locking mechanism 222A, in accordance with embodiments of the present disclosure. In some embodiments, spring-loaded locking mechanism 222A may be used to implement spring-loaded locking mechanism 222 described above. As shown in FIGS. 4A and 4B, spring-loaded locking mechanism 222A may be configured to mechanically engage with a plunger assembly 400, as described in greater detail below. As shown in FIGS. 4A and 4B, spring-loaded locking mechanism 222A may comprise a recess 410 formed in spring-loaded locking mechanism 222A. Further as shown in FIGS. 4A and 4B, plunger assembly 400 may include a plunger 402 mechanically coupled to alignment feature 216 via a spring 404 biased with a compressive spring force that biases a head 406 of plunger 402 towards alignment feature 216. Such spring force may be perpendicular to the direction of linear translation between alignment features 216 and 218.

FIG. 4A depicts spring-loaded locking mechanism 222A mechanically engaged with lock engagement feature 228 in order to prevent linear translation of alignment feature 216 relative to alignment feature 218, as described above. To disengage spring-loaded locking mechanism 222A from lock engagement feature 228 in order to allow linear translation of alignment feature 216 relative to alignment feature 218 (e.g., in order to decouple cover 204 from chassis 101), an operator may apply force (e.g., with a finger) to spring-loaded locking mechanism 222A to translate spring-loaded locking mechanism 222A from its open position to its retracted position, and mechanically manipulate plunger 400 in order to cause a tongue 408 to mechanically engage with recess 410 in order to overcome the spring force that biases spring-loaded locking mechanism 222A in the open position in order to retain spring-loaded locking mechanism 222A in its retracted position, so that alignment feature 216 may be linearly translated relative to alignment feature 218 (e.g., in order to decouple cover 204 from chassis 101). As alignment feature 216 is linearly translated relative to alignment feature 218, tongue 408 may egress from recess 410 via a cutout 412 of recess 410.

Figure 5A:
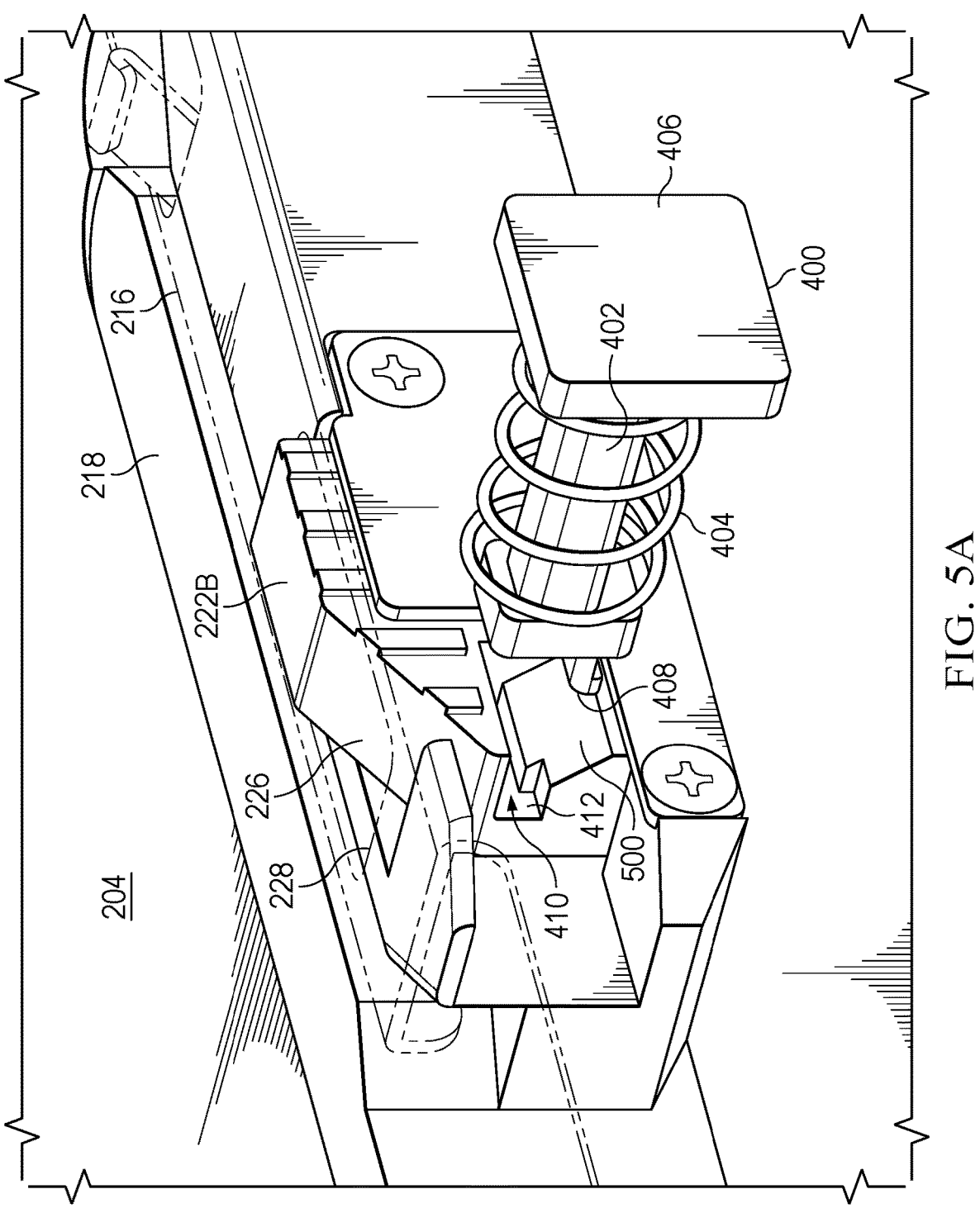
FIGS. 5A and 5B illustrate perspective close-in views of another spring-loaded locking mechanism, in accordance with embodiments of the present disclosure.
Figure 5B:
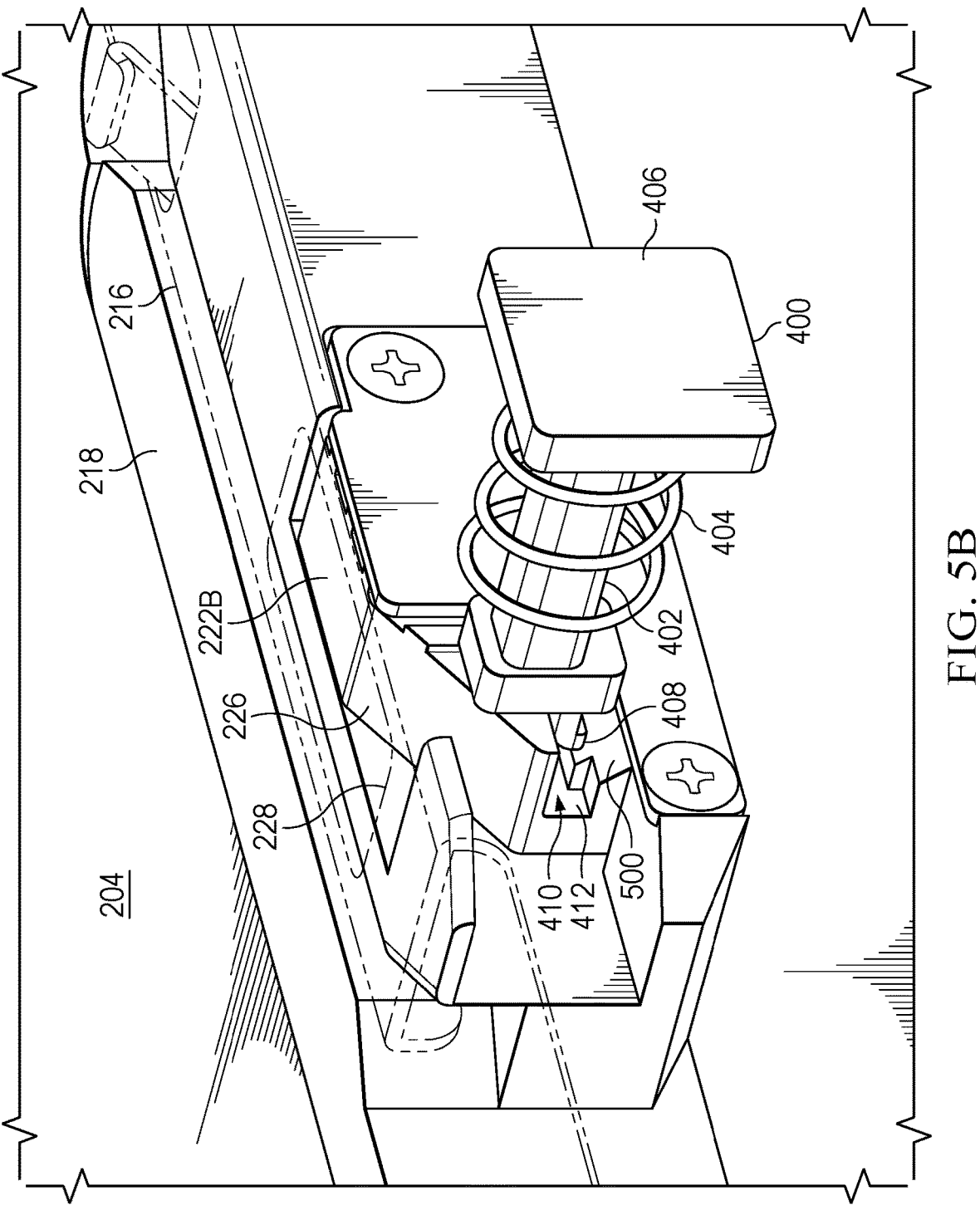

FIGS. 5A and 5B illustrate perspective close-in views of a spring-loaded locking mechanism 222B, in accordance with embodiments of the present disclosure. In some embodiments, spring-loaded locking mechanism 222B may be used to implement spring-loaded locking mechanism 222 described above. Spring-loaded locking mechanism 222B depicted in FIGS. 5A and 5B may be similar in many respects to spring-loaded locking mechanism 222A depicted in FIGS. 4A and 4B. Accordingly, only certain differences between spring-loaded locking mechanism 222A and spring-loaded locking mechanism 222B may be described herein.

In particular, spring-loaded locking mechanism 222B may include a ramped feature 500 leading from recess 410. Accordingly, when an operator applies force (e.g., with a finger) to spring-loaded locking mechanism 222B to translate spring-loaded locking mechanism 222B from its open position to its retracted position, tongue 408 may engage with ramped feature 500 such that, due to the spring force of spring 404, tongue 408 may automatically mechanically engage with recess 410 in response to spring-loaded locking mechanism 222B being translated into its retracted position in order to overcome the spring force that biases spring-loaded locking mechanism 222B in the open position in order to retain spring-loaded locking mechanism 222B in its retracted position, so that alignment feature 216 may be linearly translated relative to alignment feature 218 (e.g., in order to decouple cover 204 from chassis 101). As alignment feature 216 is linearly translated relative to alignment feature 218, tongue 408 may egress from recess 410 via a cutout 412 of recess 410.

Although FIGS. 4A, 4B, 5A, and 5B depict a plunger assembly 400 mechanically coupled to alignment feature 216, it is understood that embodiments of the present disclosure may be realized without the presence of such plunger assembly 400, such as shown in FIGS. 2 and 3.

Although the foregoing discussion contemplates use of a removable fixture to lift and move an information handling system server, the systems and methods disclosed herein may also be applied to using a fixture to lift and move any suitable physical object.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system, comprising:

a first alignment feature;

a spring-loaded locking feature mechanically coupled to the first alignment feature, the spring-loaded locking feature having a recess formed therein;

a second alignment feature configured to mechanically engage with the first alignment feature in order to, when the first alignment feature is mechanically engaged with the second alignment feature, constrain translation of the first alignment feature to the second alignment feature to a linear translation; and a plunger assembly mechanically coupled to the second alignment feature via a compressive spring that mechanically biases a plunger towards the second alignment feature, the plunger assembly comprising the plunger and a tongue extending from the plunger;

wherein:

the spring-loaded locking feature is configured to, as first alignment feature is translated relative to the second alignment feature in a first direction, mechanically translate to a locked position under a spring force bias in order to mechanically engage with a lock engagement feature of the second alignment feature in order to mechanically retain the first alignment feature in a fixed position relative to the second alignment feature; and when the spring-loaded locking feature is translated into a unlocked position, the tongue is configured to directly insert in to and mechanically engage with the recess to overcome the spring force bias to maintain the spring-loaded locking feature in an unlocked position.

2. The system of claim 1, wherein the recess comprises a cutout, such that after the spring-loaded locking feature is translated into a unlocked position and the tongue mechanically engages with the recess, the tongue is configured to pass through the cutout as the first alignment feature is translated relative to the second alignment feature in a second direction opposite to the first direction, in order to mechanically disengage the tongue from the recess.

3. The system of claim 1, wherein the a spring-loaded locking feature comprises a ramped feature configured to mechanically engage with the tongue such that the when the spring-loaded locking feature is translated into a unlocked position, the tongue is configured to automatically mechanically engage with the recess to overcome the spring force bias to maintain the spring-loaded locking feature in an unlocked position.

4. A system, comprising:

a first alignment feature;

a spring-loaded locking feature mechanically coupled to the first alignment feature, the spring-loaded locking feature having a recess formed therein;

wherein:

the first alignment feature is configured to mechanically engage with a second alignment feature in order to, when the first alignment feature is mechanically engaged with the second alignment feature, constrain translation of the first alignment feature to the second alignment feature to a linear translation;

the spring-loaded locking feature is configured to, as the first alignment feature is translated relative to the second alignment feature in a first direction, mechanically translate to a locked position under a spring force bias in order to mechanically engage with a lock engagement feature of the second alignment feature in order to mechanically retain the first alignment feature in a fixed position relative to the second alignment feature; and when the spring-loaded locking feature is translated into an unlocked position, a tongue of a plunger assembly mechanically coupled to the second alignment feature via a compressive spring that mechanically biases a plunger of the plunger assembly mechanically coupled to the tongue towards the second alignment feature is configured to directly insert in to and mechanically engage with the recess to overcome the spring force bias to maintain the spring-loaded locking feature in an unlocked position.

5. The system of claim 4, wherein the recess comprises a cutout, such that after the spring-loaded locking feature is translated into an unlocked position and the tongue mechanically engages with the recess, the tongue is configured to pass through the cutout as the first alignment feature is translated relative to the second alignment feature in a second direction opposite to the first direction, in order to mechanically disengage the tongue from the recess.

6. The system of claim 4, wherein the spring-loaded locking feature comprises a ramped feature configured to mechanically engage with the tongue such that when the spring-loaded locking feature is translated into an unlocked position, the tongue is configured to automatically mechanically engage with the recess to overcome the spring force bias to maintain the spring-loaded locking feature in an unlocked position.

7. A system, comprising:

a first alignment feature configured to mechanically engage with a second alignment feature in order to, when the first alignment feature is mechanically engaged with the second alignment feature, constrain translation of the first alignment feature to the second alignment feature to a linear translation; and a plunger assembly mechanically coupled to the first alignment feature via a compressive spring that mechanically biases a plunger towards the first alignment feature, the plunger assembly comprising the plunger and a tongue extending from the plunger;

wherein:

a spring-loaded locking feature mechanically coupled to the second alignment feature is configured to, as the second alignment feature is translated relative to the first alignment feature in a first direction, mechanically translate to a locked position under a spring force bias in order to mechanically engage with a lock engagement feature of the first alignment feature in order to mechanically retain the second alignment feature in a fixed position relative to the first alignment feature; and when the spring-loaded locking feature is translated into an unlocked position, the tongue is configured to directly insert in to and mechanically engage with a recess formed in the spring-loaded locking feature to overcome the spring force bias to maintain the spring-loaded locking feature in an unlocked position.

8. The system of claim 7, wherein the tongue is configured to, after the spring-loaded locking feature is translated into an unlocked position and the tongue mechanically engages with the recess, pass through a cutout of the recess as the second alignment feature is translated relative to the first alignment feature in a second direction opposite to the first direction, in order to mechanically disengage the tongue from the recess.

9. The system of claim 7, wherein the tongue is configured to, when the spring-loaded locking feature is translated into an unlocked position, mechanically engage with a ramped feature of the spring-loaded locking feature, such that the tongue is configured to automatically mechanically engage with the recess to overcome the spring force bias to maintain the spring-loaded locking feature in an unlocked position.

\* \* \* \* \*